United States Patent [19]

Inoko et al.

[11] 4,214,942
[45] Jul. 29, 1980

[54] APPARATUS FOR PRODUCING A PHOTO-POLYMER PLATE HAVING RELIEF IMAGE AREAS THEREON

[75] Inventors: Michio Inoko, Koganei; Shinichi Kawatsuji, Fuji; Toshiie Matsui, Mitaka; Shuu Yoshida, Kiyose, all of Japan

[73] Assignee: Asahi Kasei Kogyo Kabushiki Kaisha, Osaka, Japan

[21] Appl. No.: 30,638

[22] Filed: Apr. 16, 1979

Related U.S. Application Data

[63] Continuation of Ser. No. 908,776, May 23, 1978, abandoned.

[30] Foreign Application Priority Data

May 24, 1977 [JP] Japan ................................ 52-60338

[51] Int. Cl.² ............................................ B32B 31/00
[52] U.S. Cl. .................................. 156/500; 156/501; 156/575; 156/577; 355/100
[58] Field of Search ............... 156/390, 500, 501, 574, 156/575, 577; 222/163, 164, 166; 355/85, 93, 97, 100; 96/35.1, 87 R

[56] References Cited

U.S. PATENT DOCUMENTS

| | | | |
|---|---|---|---|
| 3,687,785 | 8/1972 | Akamatsu et al. | 96/35.1 |
| 3,832,177 | 8/1974 | Akamatsu et al. | 96/35.1 |
| 3,837,887 | 9/1974 | Akamatsu et al. | 355/100 |
| 3,848,998 | 11/1974 | Yovekura et al. | 355/100 |
| 3,971,691 | 7/1976 | Cairns | 156/500 |
| 4,056,423 | 11/1977 | Hughes | 156/575 |

*Primary Examiner*—Caleb Weston
*Attorney, Agent, or Firm*—Armstrong, Nikaido, Marmelstein & Kubovcik

[57] ABSTRACT

An apparatus for producing a photo-polymer plate having relief image areas thereon has a photo-polymerizable material feed device reciprocally movable along guide rails through a photo-polymerizable material layer forming station. The feed device has a frame supported on the rails by first and second pairs of wheels and carrying a bucket containing the photo-polymerizable material in liquid phase and tiltable to pour the material onto a protective sheet material placed on a photo-polymerizable material layer forming station when the feed device is moved over the protective sheet material. A doctor is mounted on the frame to level the layer as well as to preliminarily reduce the thickness thereof. A backing sheet material is placed over the layer to form an assembly of the two sheet material and the layer of the photo-polymerizable materials sandwiched therebetween. A laminating cylinder is mounted on the frame and disposed for rolling engagement with the backing sheet to reduce the layer to a predetermined thickness. A kind of jack is provided between the shaft of the second pair of wheels and the frame so that the operation of the jack is effective to pivotally rotate the frame about the axis of the shaft of the first pair of wheels whereby the distances of the doctor and the laminating cylinder to the surface of the protective sheet material are varied simultaneously for the adjustment of the thickness of layer. The first pair of wheels is disposed posterior to the second pair of wheels as viewed in the direction of movement of the feed device in which the photo-polymerizable material is poured to form the layer, whereby the amount of the adjustment of the spacing between the laminating cylinder and the protective sheet is smaller than that of the spacing between the doctor and the protective sheet at each time of adjustment.

12 Claims, 6 Drawing Figures

APPARATUS FOR PRODUCING A PHOTO-POLYMER PLATE HAVING RELIEF IMAGE AREAS THEREON

This is a continuation, of application Ser. No. 908,776, filed May 23, 1978, abandoned.

This invention relates to apparatus for producing a photo-polymer plate having relief image areas thereon, e.g. a relief printing plate or intaglio printing plate for use in a photo-gravure process, from a suitable photo-polymerizable composition, and more particularly the invention is concerned with means for supplying a photo-polymerizable material for use in the apparatus of the type described which means is capable of readily setting the thickness of the plate to be produced at any level as desired.

Metallic printing plates having relief image areas thereon hitherto in use for printing newspapers and other printed matters have, in recent years, tended to give way to photo-polymer plates which are formed of photo-polymerizable materials.

The photo-polymerizable materials used for this purpose include a variety of compositions having different characteristics. Some of them are APR (the trade name of a composition produced by Asahi Kasei Kogyo Kabushiki Kaisha), Dycril (the trade name of a composition produced by E. I. Du Pont de Nemours & Co.), Tilon (the trade name of a composition produced by Time Company) and Sonne (the trade name of a composition produced by Kansai Paint Kabushiki Kaisha). The usual practice for producing a photo-polymer plate having relief image areas thereon by using any one of these materials is to polymerize and harden desired regions of a layer of such material by exposing the material through an image-bearing transparency, e.g. a negative or positive film, to actinic radiation so as to render such regions insoluble to wash-out liquid, and to wash out non-exposed, unhardened regions of the layer in the wash-out step, so that the exposed, hardened regions of the layer will serve as relief image areas of the photo-polymer plate.

The use of this type of photo-polymer plate offers many advantages as compared with metallic plates which have hitherto been in use. First, the operation for producing a plate can be simplified and the process steps used for producing a plate can be greatly reduced. Secondly, the environment for the workers engaged with the production of printing plates can be improved because the production of photo-polymer plates with relief image areas thereon does not require the use of an etching solution hitherto used for engraving metallic plates. Thirdly, the step for disposing of spent solutions can be simplified.

Different types of apparatus for producing photo-polymer plates having relief image areas thereon have hitherto been developed to serve different purposes. One type of apparatus is disclosed in U.S. Pat. No. 3,848,998. In recent years, application of a photo-polymer plate of this type in the field of flexographic printing process has been gaining ground. As a result, there has been an increasing demand for the development of a device for enabling the thickness of the photo-polymer plates produced to be varied more readily than has been the case, because it has become necessary to change more frequently the thickness of the plates produced than has been required.

The prior art apparatus for producing a photo-polymer plate having relief image areas thereon of the prior art have had a disadvantage that the apparatus lacks facilities for readily changing the thickness of the plates to be produced. The present state of the art is such that alteration of the thickness of the plates involves a complex and time consuming process. For example, in the field of flexographic printing, there is a need to change the thickness of plates from about 1 mm to about 10 mm. In changing the thickness of photo-polymer plates to be produced by the prior art apparatus, adjustments must be made to a large number of machine sections. Typical machine section to be adjusted is a photo-polymerizable material layer thickness setting mechanism and, more particularly, the laminating cylinder gap, the doctor gap and the gap of bucket guide members for preventing the spreading of the material beyond a predetermined zone. Spaces in the exposure station must also be adjusted. The present practice to make such adjustments is to temporarily remove the machine parts involved or to loosen screws for thereby allowing adjustments to be made. Adjustments to machine parts must be made such that the parts after adjustments are well balanced. Thus, to make adjustments to respective machine sections is time consuming and involves a lot of labor. For example, it takes about half a day to make adjustments to machine sections to adapt a machine to a newly desired thickness of a photo-polymer plate to be produced. It is the photo-polymerizable material feed means that needs the most complex adjustments.

It is an object of the present invention to provide an improved apparatus for producing a photo-polymer plate having relief image areas thereon.

It is another object of the present invention to provide an apparatus of the class specified and including a photo-polymerizable material feed means which is so improved as to be readily adjustable and adaptable to a desired thickness of a photo-polymer plate to be produced.

According to the present invention, there is provided an apparatus for producing a photo-polymer plate having relief image areas thereon, including a photo-polymerizable material layer forming station, photo-polymerizable material feed means, and guide rails along which said feed means are reciprocally movable through said station, said feed means including means for pouring said material onto a first sheet material placed on said station to form a layer of said material on said sheet material, a doctor for levelling and preliminarily reducing the thickness of the layer of said material, means for feeding a second sheet material onto said layer to form a laminated assembly of said first and second sheet materials and said layer of photo-polymerizable material sandwitched therebetween, a laminating cylinder so disposed as to be in rolling engagement with said assembly to reduce said layer to a predetermined thickness, a frame, and first and second pairs of wheel means supporting said frame and being disposed in rolling engagement with said rails to move said frame along said rails, said first wheel means being disposed in a position which is posterior to the position of said second wheel means as viewed in the direction of movement of said feed means in which said photo-polymerizable material is poured to form the layer in said station, said laminating cylinder and said doctor being movable with said frame along said rails and positioned such that said laminating cylinder is posterior to said doctor as viewed in said direction, said feed means further including means for adjusting the levels of said laminating cylinder and said doctor such that the spacing between said laminating cylinder and said guide rails and between said doctor and said rails are simultaneously adjusted and such that the amount of the adjustment of the spacing between the laminating cylinder and said rails is smaller than that of the spacing between said doctor and said rails at each time of adjustment.

The laminating cylinder and the doctor may preferably be mounted on the frame. The adjusting means may include means for changing the relative positions of the second wheel means and the frame so that the frame is pivotally moved about the axis of the first wheel means. The changing means may include connector means connecting the frame to the second wheel means and means for varying the angle defined between the connector means and the frame. The angle varying means may comprise a rotatable rod-shaped member in threadable engagement with the frame and having an end in abutment engagement with the connector means at a point in vertical alignment with the shaft of the second wheel means. The changing means may alternatively include slide means connected to the second wheel means and substantially vertically movable relative to the frame and cam means mounted on one of the frame and the slide means and having a portion in engagement with the other so that the operation of the cam means changes the relative positions of the slide means and the frame to pivotally move the frame about the axis of the first wheel means.

The adjusting means may alternatively include an auxiliary frame member mounted on the frame and supporting the laminating cylinder and the doctor. The auxiliary frame member may have one end pivotally connected to the frame adjacent to the axis of the first wheel means, and means for changing the relative positions of the other end of the auxiliary frame member and the frame so that the auxiliary frame member is rotated relative to the frame. The changing means may include connector means connecting the other end of the auxiliary frame member to the frame, and means for varying the angle between the frame and the auxiliary frame member. The angle varying means may include a rotatable rod-like member threadably engaged with the auxiliary frame member and having an end in abutment engagement with the connector means.

The spacing between the axis of the shaft of the first wheel means and the doctor may preferably be within the range of from 1.2 to 3 times of the spacing between the axis of the shaft of the first wheel means and the laminating cylinder.

The pouring means may preferably comprise a bucket containing the photo-polymerizable material in liquid phase and so constructed as to pour the material when the feed means is moved over the first sheet on the station. The bucket may preferably be supported such that a predetermined spacing is maintained between the bucket and the guide rails in the station irrespective of the operation of the adjusting means to adjust the spacings between the laminating cylinder and the guide rails and between the doctor and the rails. The bucket may more preferably be supported either by the second wheel means or different wheel means other than the first and second wheel means and provided for rotation on the guide rails.

The above and other objects, features and advantages of the present invention will be made apparent by the following description with reference to the accompanying drawings.

Figure 1:
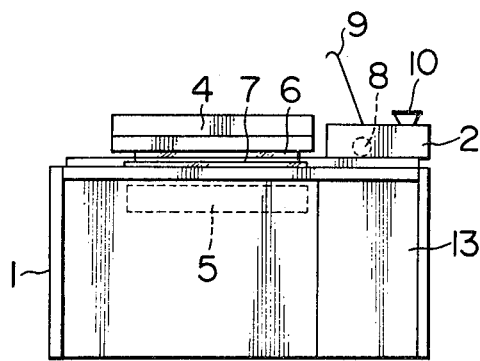
FIG. 1 is a schematic front view of an embodiment of an apparatus for producing a photo-polymer plate having relief image areas thereon with some parts of the apparatus being removed.
Figure 2:
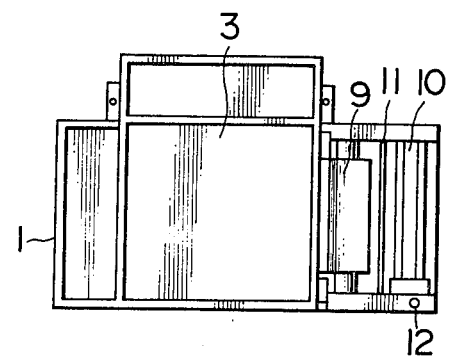
FIG. 2 is a schematic plan view of the apparatus with some parts being removed.

Referring first to FIGS. 1 and 2 of the drawings, reference numeral 1 designates a main body of the apparatus, reference numeral 2 designates photo-polymerizable material feed means, and numeral 3 designates a photo-polymerizable material layer forming station (hereinafter, simply referred to as a "station") which serves concurrently as an exposure station. In the station 3, there are provided an upper light source box 4, a lower light source box 5, an upper glass plate 6 and a lower glass plate 7. The upper glass plate 6 is rigidly secured to the underside of the upper light source box 4 to form an assembly which is pivotably supported at the portion of the apparatus disposed in the upper part of FIG. 2 and pivotally moved by upper light box swinging means which may be in the form of an electrically operated cylinder (not shown). The exposure station may be modified, as is necessary, to resemble the exposure station shown in U.S. Pat. No. 3,848,998, for example. Reference numeral 8 designates a laminating cylinder; numeral 9a chute for introducing a backing material; numeral 10a bucket; numeral 11a doctor; and numeral 12a plate thickness adjusting dial. Reference numeral 13 denotes a box housing therein control means for the light sources and various mechanisms and power supply means. The box 13 has switches, indicating lamps, etc. mounted on its surface.

The apparatus constructed as above generally operates as follows. First, the upper light source box 4 is swung to its open position, and an image-bearing transparency, e.g. negative film, is placed on the lower glass plate 7. The image bearing transparency is covered with a protective film for preventing the adhesion of a photo-polymerizable material thereto. Then, the feed means 2 is moved from its starting position shown in FIG. 1 to the station 3. The feed means 2 is then returned to its starting position in FIG. 1 while the bucket 10 is rotated to feed the photo-polymerizable material onto the protective film on the station 3. At this time, a backing material is supplied through the chute 9 and laminated by the laminating cylinder 8 onto a photo-polymerizable material layer applied to the protective film. The laminating cylinder 8 performs the function of adjusting the assembly of photo-polymerizable material layer and backing material to a predetermined thickness. Since the doctor 11 is located anterior to the laminating cylinder 8 with respect to the direction of movement of the feed means 2, the doctor 11 preliminarily forms a layer of the photo-polymerizable material prior to the adjustment of the thickness of the assembly of the layer of the photo-polymerizable material and the backing material by the laminating cylinder 8. The spacing between the bottom edge of the doctor 11 and the upper surface of the station 3 is greater than the spacing between the lowermost portion of the outer periphery of the laminating cylinder 8 and the upper surface of the station 3.

Upon completion of the aforementioned steps in the station 3, the upper light source box 4 is swung back to its closed position. Then, the photo-polymerizable material layer is exposed, through the backing material, to actinic radiation from the upper light source, so that the photo-polymerizable material layer is subjected to pre-exposure from above through the backing material. Thereafter, the photo-polymerizable material layer is exposed to actinic radiation through the image-bearing transparency by the lower light source. It is to be noted that it is not essential to subject the photo-polymerizable material layer to the exposure from above through the backing material. When this is the case, the upper light box 4 may be replaced by a pressure plate to hold down the assembly of the backing material, the photo-polymerizable material layer and the protective film onto the transparency. Exposure of the photo-polymerizable material layer to actinic radiation for forming the relief image areas thereon may alternatively be performed from above.

When the exposure steps have been carried out, the upper light source box 4 is again swung to its open position, and the photo-polymerizable material layer is removed from the exposure station 3 together with the backing material and the protective film. After the protective film is stripped from the assembly, the assembly of the photo-polymerizable material layer and the backing material is forwarded to the next wash-out station where non-exposed, unhardened regions of the layer are washed out and the layer is then dried to form a completed photo-polymer plate having relief image areas thereon. Preferred types of the photo-polymerizable material, protective film and backing material, preferred types of the light sources, and preferred example of the wash-out step are disclosed in detail in U.S. Pat. No. 3,848,998.

Figure 3:
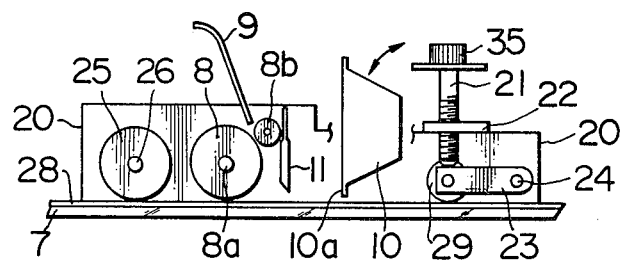
FIG. 3 is a schematic front view of a photo-polymerizable material feed means of the apparatus of the invention with some parts of the feed means being removed.
Figure 4:
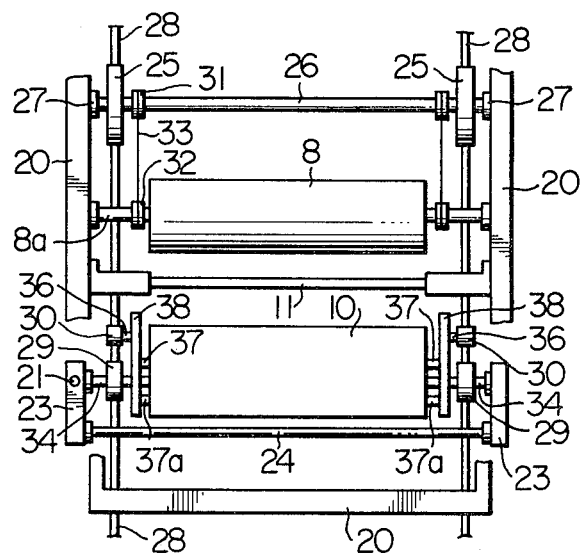
FIG. 4 is a plan view of the photo-polymerizable material feed means with some parts being removed.

FIGS. 3 and 4 show the photo-polymerizable material feed means 2 in detail. In the drawings, certain parts are shown schematically for the convenience of explanation. In these figures, reference numeral 20 designates a frame having mounted thereon a shaft 8a for supporting the laminating cylinder 8, the doctor 11, the chute 9 for supplying the backing material, an auxiliary laminating roll 8b cooperative with the laminating cylinder 8 to hold the backing material therebetween, a plate 22 formed therein with a threaded opening for threadably receiving an externally threaded portion of a rod-shaped member 21 which functions as drive means for connectors 23, a shaft 24 rotatably connecting the connectors 23 together, and bearings 27 for supporting a shaft 26 for a pair of wheels 25 constituting first wheel means. Reference numeral 28 designates guide rails 28 extending to the end of the lower glass plate 7, which is remote from the feed means 2, to guide the movement of the wheels 25 of the first wheel means, wheels 29 of a second wheel means, and wheels 30 for the bucket 10. The feed means 2 as a whole is caused to travel on the rails 28 by drive means, not shown. The laminating cylinder 8 is caused to rotate in synchronism with the travel of the feed means 2 by means of belts 33 trained over pulleys 31 mounted on the shaft 26 of the first wheel means 25 and pulleys 32 mounted on the shaft 8a of the laminating cylinder 8. Preferably, the dimensions of the pulleys 31 and 32 or the wheels 25 are selected such that the peripheral speed of the outer peripheral surface of the laminating cylinder 8 is equal to the travelling speed of the feed means 2.

Each of the connectors 23 is pivotally connected at one end thereof to the shaft 24 and rigidly secured at the other end to a shaft 34 of the wheels 29 of the second wheel means. A bearing (not shown) is mounted between the shaft 34 and each wheel 29 so that only the wheels 29 rotate when the feed means 2 travels. It is to be understood, however, that the shaft 34 may be rigidly secured to the wheels 29 for rotation therewith. When this is the case, said the other end of each connector 23 is connected to the shaft 34 for rotation relative to the shaft.

The rod-shaped member 21 has rigidly secured to its top a dial 35 which is graduated or provided with a pointer of a suitable type so as to coact with a pointer or a graduation on the frame 20 to give a reading of the thickness of the photo-polymerizable material layer to be formed. The rod-shaped member 21 has a bottom end which is in abutment engagement with the top face of one of the connectors 23 and which is in vertical alignment with the shaft 34.

The bucket 10 is pivotally mounted at its bottom on a shaft 37 which is journaled at its opposite ends by a pair of side plates 38 which are connected together by a rod member 37a which supports the bottom of the backet 10. The side plates 38 are mounted on the shaft 34 of the wheels and also on axles 36 of wheels 30 so that the plates 38 are supported in a substantially fixed angular position relative to the rails 28. The bucket 10 may be tilted or rotated about the axis of the shaft 37. However, it is to be understood that the support for the bucket 10 is not limited to the aforementioned arrangement and the bucket 10 may be supported by four wheels independent of and separate from the shaft 34 and capable of rotating on the rails 28. In other words, any arrangement may be used for supporting the bucket 10 so long as the lower pouring edge 10a of the bucket 10 when it is rotated to its pouring position is spaced apart from the upper surface of the station 3 a predetermined distance during its travel along the rails 28, irrespective of any angular position to which the frame 20 is pivotally moved. It is essential that a means which makes the bucket smoothly movable relative to the axles 36, such as a clutch mechanism or the like, be provided between the bucket and the axles. The bucket may be either of the type which can be rotated in either direction or of the type which has an openable bottom for releasing a photo-polymerizable material in the station 3.

The photo-polymerizable material feed means constructed as above operates as follows when the thickness of the photo-polymer plate to be produced must be changed. The dial 35 mounted on the rod-shaped member 21 will be rotated to increase the thickness of the photo-polymer plate to a desired dimension. The rod-shaped member 21 moves downwardly relative to the frame 20 because the rod-shaped member 21 is threadably extending through the plate 22 secured to the frame 20. However, since the bottom end of the rod-shaped member 21 is in abutting engagement with one of the connectors 23 fixed to the shaft 34 of the second wheel means 29, the rod-shaped member 21 is unable to downwardly move the portion of the connector 23 in engagement therewith and thus the plate 22 is moved upwardly with the result that the frame 20 is pivotally moved together with the plate 22 in counterclockwise direction as viewed in FIG. 3. At this time, the rod-shaped member 21 naturally tilts counterclockwise. However, this tilting movement is so small in degree that it is negligible from the operational point of view. Thus, as the frame 20 is povitally moved counterclockwise in FIG. 3, one end of each connector 23 moves upwardly while the shaft 24 is rotating relative thereto and the other end of each connector 23 angularly moves with the wheels 29 about the shaft 34.

The frame 20 is connected at one end thereof to the shaft 26 of the first wheel means 25 for pivotal movement relative thereto, so that the counterclockwise pivotal movement of the frame 20 takes place about the axis of the shaft 26 of the first wheel means 25. Thus the counterclockwise pivotal movement of the frame 20 causes the laminating cylinder 8 and the doctor 11 to move upwardly relative to the rails 28, although the wheels 25 and 29 and the wheels 30 for the bucket 10 remain in contact with the rails 28. By this arrangement, it is possible to increase the thickness of the photo-polymer plate to be produced. When it is desired to reduce the thickness of the plate, the end can be attained by causing the elements involved to operate in a manner opposite to that described hereinabove.

The bucket 10 is advantageously left independent of the thickness adjusting operation for reasons stated hereinafter. When the bucket 10 is tilted for feeding a photo-polymerizable material in the station 3, the lower pouring edge 10a of the bucket is spaced from the upper surface of the station 3 a considerably greater distance than the thickness of the plate to be produced, so that there is no significance in adjusting the distance in accordance with the thickness of the plate. It is more important that bucket guide means are conventionally provided on both sides of the bucket 10 for preventing overflow or spreading of a photo-polymerizable material in a direction normal to the direction of movement of the feeding means 2 or to regions outside the surface of the station 3 when the bucket 10 is tilted for feeding the material in the station 3. The bucket guide means and the upper surface of the station 3 are closely spaced from each other and thus it becomes necessary to effect readjustments of the bucket guide means separately of the bucket if the bucket itself is adjusted when the thickness of the plate to be produced is to be changed. In the aforesaid embodiment, however, the bucket 10 is supported by the shaft 34 of the second wheel means 29 which has nothing to do with the pivotal movement of the frame 20. This arrangement eliminates the problem mentioned hereinabove in regard to the bucket guide means.

As can be seen in FIG. 3, the wheels 25 of the first wheel means, laminating cylinder 8, doctor 11 and bucket 10 of the photo-polymerizable material feed means 2 are arranged in the mentioned order as seen from the trailing end toward the leading end of the feed means 2 in its travel or stroke to form a photo-polymerizable material layer on the protective film placed on the surface of the station 3. Therefore, when the frame 20 is pivotally moved for adjusting the thickness of the layer to be produced, the pivotal movement of the frame 20 exerts, at all times, a smaller variation in the spacing between the lowermost portion of the outer periphery of the laminating cylinder 8 and the upper surface of the station 3 than in the spacing between the lower most portion of the doctor 11 and the upper surface of the station 3. Stated in other words, a change caused to the gap between the laminating cylinder 8 and the station 3 is smaller than a change caused to the gap between the doctor 11 and the station 3. This is desirable as compared with the case in which these two gaps undergo the same change. Preferably, the thickness of a photo-polymerizable material layer preliminarily formed by the doctor 11 is about 1.2 to 3 times of the thickness of the layer ultimately adjusted by the laminating cylinder 8. The optimum range is considered to be from about 1.3 to about 1.6 times. This range is determined by taking into consideration the biting of the laminating cylinder 8 into the photo-polymeriable material layer and the reduction ratio of the layer of the material. Therefore, once the relation between the thickness of a layer preliminarily formed by the doctor and the thickness of a layer ultimately adjusted by the laminating cylinder is established for a given thickness of the photo-polymer plate, it is desirable that there should be no great change in the relation even if the thickness of the plate to be produced is changed.

It will be apparent that, when adjustments of the thickness of plates to be produced are effected by arranging the elements of the feed means 2 as aforesaid and by pivotally moving the frame 20 with the first wheel means 25 serving as a fulcrum, the establishment of the aforesaid relationship between the thicknesses of the layer of the photo-polymerizable material adjusted by the doctor and the laminating cylinder 8 achieves the object of the invention. It is advantageous to establish the ratio of the distance between the axis of the first wheel means 25 and the doctor 11 to the distance between the axis of the first wheel means 25 and the laminating cylinder 8 such that the ratio is from about 1.2/1 to about 3/1. This range of the distance ratio is substantially equal to the ratio of the gaps between the doctor 11 and the surface of the station 3 and between the cylinder 8 and the surface of the station 3.

Figure 5:
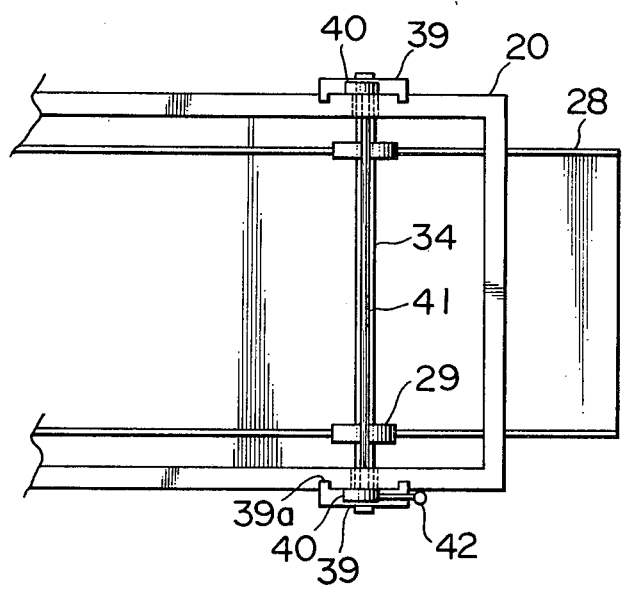
FIG. 5 is a plan view of a photo-polymerizable material feed means of a second embodiment of the invention with some parts of the feed means being removed.
Figure 6:
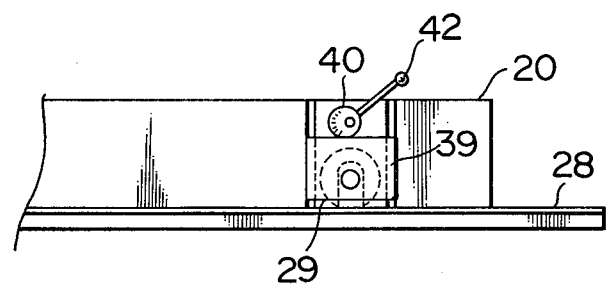
FIG. 6 is a side view of the photo-polymerizable material feed means shown in FIG. 5 with some parts being removed.

A second embodiment of the means for adjusting the distances of the doctor 11 and the laminating cylinder 8 to the surface of the station 3 is shown in FIGS. 5 and 6 and comprises a pair of laterally aligned slide members 39 connected to the ends of the shaft 34 for relative rotation with respect to each other and are slidable along substantially vertical grooves 39a formed in the outer side faces of a frame 20. Eccentric cam members 40 are secured to the ends of a shaft 41 which rotatably extends through opposite side sections of the frame 20. The cam members 40 are in engagement with the tops of the slide members 39. One of the cam members is provided thereon with a dial and secured to a layer 42 so that the cam members are rotated in either direction by means of the lever 42 about the axis of the shaft 41 to tilt the frame 20 for thereby adjusting the thickness of a photo-polymer plate to be produced.

From the foregoing description, it will be appreciated that the present invention provides improvements in the photo-polymerizable material feed means. The photo-polymerizable feed means of the apparatus according to the present invention is simple in structure and easily operable to adapt the apparatus to the production of photo-polymerizable material layer of desired thickness.

What is claimed is:

1. In an apparatus for producing a photo-polymer plate having relief image areas thereon, including a photo-polymerizable material layer forming station comprising a substantially horizontal flat surface, and a carriage reciprocally movable through said station, said carriage having mounted thereon means for pouring said photo-polymerizable material onto a first sheet material placed on said flat surface of said station, thereby forming a layer of said photo-polymerizable material on said first sheet material, a doctor for levelling and preliminarily reducing the thickness of the photo-polymerizable material layer, means for feeding a second sheet material onto said photo-polymerizable material layer to form a laminated assembly of said first and second sheet materials with said photo-polymerizable material layer sandwiched therebetween, and a laminating cylinder disposed in rolling engagement with said second sheet material of said laminated assembly to finally reduce said photo-polymerizable material layer to a predetermined thickness, the improvement comprising support means having said laminating cylinder mounted thereon, and level adjusting means coupled to said support means for tilting said support means, together with said doctor and laminating cylinder relative to said horizontal flat surface of said station, whereby the spacing between said laminating cylinder and said flat surface and the spacing between said doctor and said flat surface are simultaneously adjusted by said level adjusting means, and wherein said doctor, said laminating cylinder, said support means and the level adjusting means are positioned relative to each other such that the amount of the adjustment of the spacing between said laminating cylinder and said flat surface is smaller than that of the spacing between said doctor and said flat surface.

2. An apparatus as claimed in claim 1 wherein said support means comprises a frame mounted on first and second pairs of wheels in rolling contact with a pair of parallel guide rails, said rails which define a plane parallel to said horizontal flat surface, said first pair of wheels being disposed between said laminating cylinder and one end of said frame, and said second pair of wheels being disposed between said doctor and the other end of said frame, and wherein said level adjusting means includes means for changing the relative positions of said second wheels and said frame such that said frame is pivotally moved about the axis of said first pair of wheels.

3. An apparatus as claimed in claim 2, wherein said adjusting means include connector means connecting said frame to said second wheel means and means for varying the angle defined between said connector means and said frame.

4. An apparatus as claimed in claim 3, wherein said angle varying means comprises a rotatable rod-shaped member in threadable engagement with said frame and having an end in abutment engagement with said connector means at a point in vertical alignment with the shaft of said second wheel means.

5. An apparatus as claimed in claim 2, wherein said changing means include slide means connected to said second wheel means and substantially vertically movable relative to said frame, and cam means mounted on one of said frame and said slide means and having a portion in engagement with the other so that the operation of said cam means changes the relative vertical positions of said slide means and said frame to pivotally move said frame about the axis of said first wheel means.

6. An apparatus as claimed in claim 1 wherein said support means includes a main frame mounted on first and second pairs of wheels disposed in rolling contact with a pair of parallel guide rails which define a plane parallel to said horizontal flat surface, and an auxiliary frame member pivotally mounted at one end to said main frame, and wherein said level adjusting means comprises means for changing the relative positions of the other end of said auxiliary frame member and said main frame such that said auxiliary frame member is angularly moved relative to said main frame.

7. An apparatus as claimed in claim 6, wherein said adjusting means include connector means connecting said the other end of said auxiliary frame member to said main frame, and means for varying the angle between said frame and said auxiliary frame member.

8. An apparatus as claimed in claim 7, wherein said angle varying means include a rotatable rod-shaped member threadably engaged with said auxiliary frame member and having an end in abutment engagement with said connector means.

9. An apparatus as claimed in claim 2, wherein the spacing between the axis of the shaft of said first wheel means and said doctor is within the range of from 1.2 to 3 times of the spacing between the axis of the shaft of said first wheel means and said laminating cylinder.

10. An apparatus as claimed in claim 2 wherein said pouring means comprises a bucket containing the photo-polymerizable material in liquid phase for pouring the material when said support means is moved over said first sheet on said station, said bucket being supported such that a predetermined spacing is maintained between said bucket and said guide rails in said station irrespective of the operation of said adjusting means to adjust the spacings between said laminating cylinder and said guide rails and between said doctor and said rails.

11. An apparatus as claimed in claim 10, wherein said bucket is supported by said second wheel means.

12. An apparatus as claimed in claim 10, wherein said bucket is supported by wheel means other than said first and second wheel means, said other wheel means being also rotatable on said guide rails.

* * * * *